United States Patent [19]

Carbrey

[11] 4,185,275
[45] Jan. 22, 1980

[54] CAPACITIVE ANALOG TO DIGITAL CONVERTER

[75] Inventor: Robert L. Carbrey, Boulder, Colo.

[73] Assignee: Bell Telephone Laboratories, Incorporated, Murray Hill, N.J.

[21] Appl. No.: 928,163

[22] Filed: Jul. 26, 1978

[51] Int. Cl.² .................................... H03K 13/09
[52] U.S. Cl. .................... 340/347 AD; 340/347 M
[58] Field of Search .... 340/347 M, 347 AD, 347 NT, 340/347 C; 324/99 D, 111

[56] References Cited

U.S. PATENT DOCUMENTS

| | | | |
|---|---|---|---|
| 3,449,741 | 6/1969 | Egerton | 340/347 AD |
| 3,626,408 | 12/1971 | Carbrey | 340/347 AD |
| 4,129,863 | 12/1978 | Gray et al. | 340/347 AD |

OTHER PUBLICATIONS

The Engineering Staff of Analog Devices, Inc., Analog–Digital Conversion Handbook, 1972, pp. II-46 to 48; III-78, 79.

Primary Examiner—Thomas J. Sloyan
Attorney, Agent, or Firm—Peter Visserman

[57] ABSTRACT

The disclosed analog to digital converter employs a single signal propagation path thereby necessitating only one holding capacitor (101) per stage (STAGE 1) of coding. The first terminal (B) of each holding capacitor (101) is connected to a reference voltage (L1) such as a resistive divider (106, 116, 126, 136, 146, 150, 151, $V_{HI}$) which has binary weighted taps (L1–L5). The other terminal (A) of each holding capacitor (101) is connected to the analog signal input (INPUT). The reference voltage (L1) and the analog sample (V1) are compared and, for a zero decision, the stored analog sample (V1) is directly passed on to the subsequent stage (STAGE 2) by a buffer circuit (102). For a one decision, the aforementioned first terminal (B) of the holding capacitor (101) is switched from the tap of the resistive divider to circuit ground thereby subtracting that binary weight (L1) from the signal (V1) stored on the holding capacitor (101). When the subtraction operation is complete, the remaining signal (V1–L1) is passed through the buffer circuit (102) to the subsequent stage (STAGE 2).

5 Claims, 2 Drawing Figures

CAPACITIVE ANALOG TO DIGITAL CONVERTER

TECHNICAL FIELD

This invention relates to analog to digital converters and in particular to a capacitive analog to digital converter wherein a single signal propagation path is employed to implement the translation, thereby necessitating only one capacitor per stage for analog to digital conversion.

BACKGROUND ART

There have been numerous prior art analog to digital converters employing capacitors in their operation. A typical one is disclosed in U.S. Pat. No. 3,449,741 which was issued June 10, 1969 to M. W. Egerton, Jr., which patent discloses an analog to digital converter which employs a matched pair of capacitors as a quantum level generator. The matched pair of capacitors are initially charged to a reference voltage and then alternately switched in parallel and to ground to obtain a binarily decreasing staircase waveform. These decreasing increments of charge are sequentially added to a prior state stored voltage and compared with the analog sample to be coded. The result of this comparison determines whether the charge increment is retained or removed from the stored generated voltage.

U.S. Pat. No. 3,626,408 issued on Dec. 7, 1971 to R. L. Carbrey discloses a charge redistribution coder circuit. The Carbrey coder circuit also employs a matched pair of capacitors as a quantum level generator. The matched pair of capacitors are initially charged to a reference voltage and then alternately switched in parallel and to ground to obtain a binarily decreasing staircase waveform. These decreasing increments of charge are sequentially added to a prior state voltage stored on a third capacitor and compared with the analog sample to be coded. The result of this comparison determined whether this charge increment is to be added to a fourth capacitor which stores the cumulative coded result.

These prior art coder circuits all employ matched capacitors and charge redistribution techniques to sequentially generate a binarily decreasing staircase waveform which is added to a prior state voltage to match the analog sample voltage stored on a separate holding capacitor. These charge redistribution capacitors must be precisely matched to accurately generate the binarily decreasing staircase waveform. Capacitor mismatch is thus a major source of error in the operation of these prior art analog to digital converter circuits. Additionally, these coders operate sequentially and require n decision intervals to generate one n bit word. For wideband signals, such as video or multiplexed Pulse Amplitude Modulation signals, these prior art single bit coders may not operate with sufficient speed.

An alternative coding arrangement is the wave coding technique wherein n individual coding circuits are provided. The result of each individual bit decision is propagated to the subsequent stage for a decision therefore coding incoming signals n times faster than the above-mentioned successive approximation type coder which employs only one decision circuit. A typical prior art wave coder however, requires a number of parallel signal propagation paths which therefore requires a multiplicity of matched components.

DESCRIPTION OF THE INVENTION

The foregoing problems are solved and a technical advance achieved by an arrangement which does not require matched capacitors or multiple signal propagation paths to achieve the required translation. In particular, a resistive voltage divider supplies the binarily decreasing reference voltages and the analog sample is sequentially compared to these reference voltages and reduced by that amount, if required, before being transferred to the subsequent stage for the next comparison to achieve the required conversion. Only a single signal propagation path is employed in the disclosed analog to digital converter circuit, thereby necessitating only one holding capacitor per stage and these holding capacitors need not be matched components since each stage of the converter is isolated from adjacent stages by buffer circuits.

This is accomplished by connecting the first terminal of each holding capacitor to a reference voltage such as a resistive voltage divider which has binary weighted taps. The other terminal of each holding capacitor is connected to the analog signal input. The reference voltage and the analog sample are compared and, for a zero decision, the stored analog sample is directly passed on to the subsequent stage by a buffer circuit. For a one decision, the aforementioned first terminal of the storage capacitor is switched from the resistive divider to ground thereby subtracting that reference voltage from the signal stored on the holding capacitor. When the subtraction operation is complete, the remaining signal is passed through the buffer circuit to the subsequent stage. The buffer circuits isolate one stage of the analog to digital converter from the next and, therefore, capacitor values for each stage may be arbitrarily selected. The only matched components in the disclosed analog to digital converter are the resistors in the voltage divider and these elements are easily matched to a high degree of accuracy.

DETAILED DESCRIPTION - (FIGS. 1 AND 2)

Figure 1:
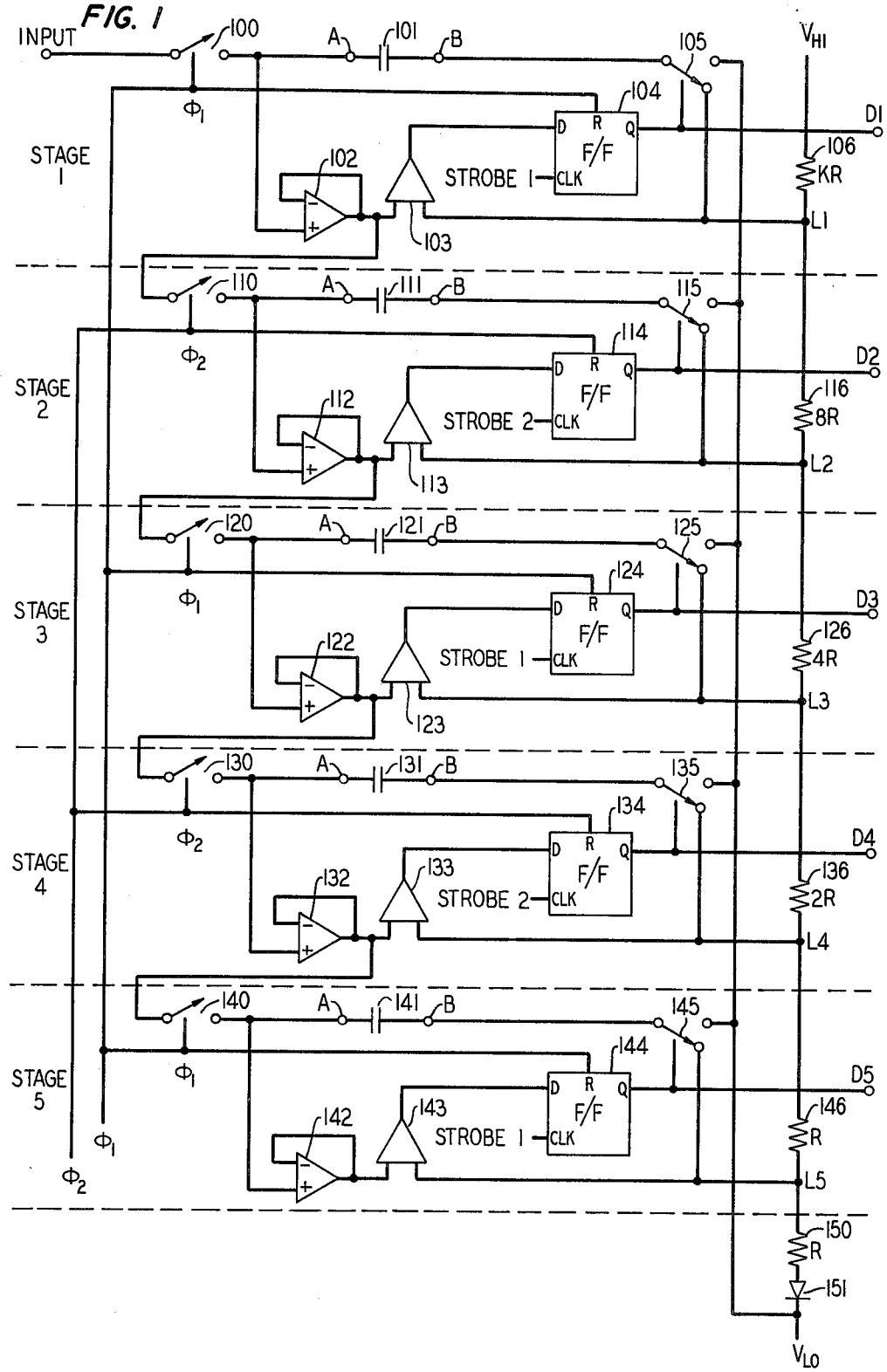
FIG. 1 shows the details of the disclosed capacitive analog to digital converter.
Figure 2:
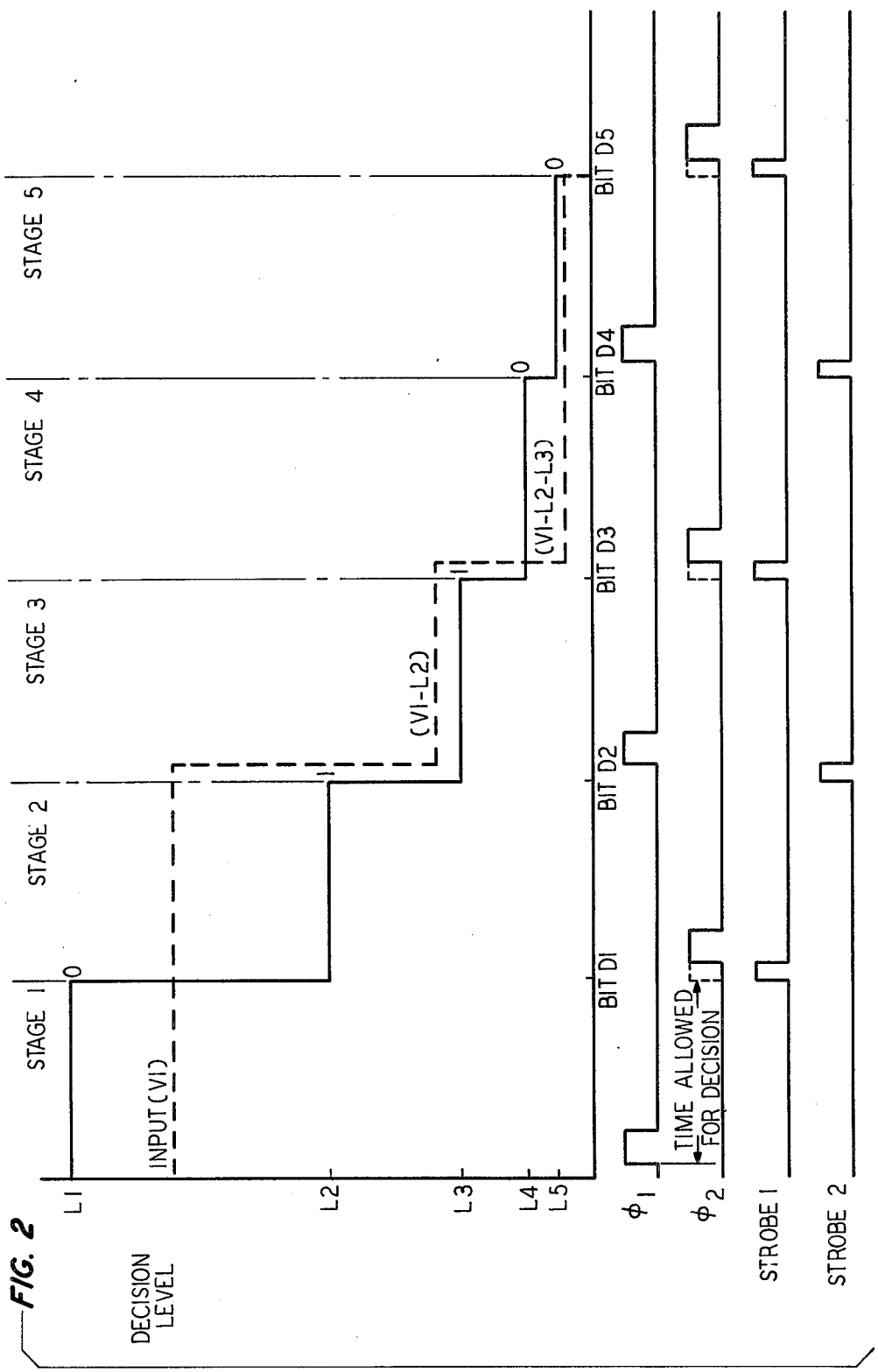
FIG. 2 shows the typical voltage waveforms appearing in the subject capacitive analog to digital converter.

FIG. 1 illustrates the capacitive analog to digital converter of my invention which employs a single signal propagation path to implement signal translation, thereby necessitating only a single signal capacitor per stage of coding. FIG. 2 illustrates the voltage waveforms employed in the translation of a typical analog sample by the disclosed capacitive analog to digital converter.

For the purpose of this disclosure, it is assumed that a sample of an analog signal voltage V1 is applied to the input terminal INPUT of the subject capacitive analog to digital converter, which converter will translate the analog input signal V1 into a five-bit digital signal. The resultant digital signal will appear on the digital output terminals (D1–D5) of the subject analog to digital converter.

Analog input signal V1 is placed on the input terminal INPUT of the capacitive analog to digital converter and closed switch 100 applies a sample of this signal to the first terminal A of capacitor 101 as well as to the positive input terminal of buffer amplifier 102. Switch 100 operates in response to clock signal φ1 while switch 110 operates in response to clock signal φ2, which signal is 180 degrees out-of-phase with respect to clock signal φ1. Therefore, when switch 100 is closed, switch 110 will be open and vice versa.

Switches 100, 110, 120, 130, 140, 105, 115, 125, 135, 145 can be either electromechanical switches or semiconductor switches, both of which are well known in the art. For simplicity sake, these switches have been shown in standard diagrammatic fashion on FIG. 1 and what is relevant to the disclosure is the fact that these switches operate in response to electrical control signals such as clock signals φ1 and φ2.

Returning to the description, analog input signal V1 is applied to the second terminal A of capacitor 101 while the first terminal B of capacitor 101 is connected through closed switch 105 to voltage L1 of the resistive voltage divider comprised of resistors 106, 116, 126, 136, 146, 150, diode 151 and voltages $V_{HI}$ and circuit ground. The aforementioned resistive voltage divider is a standard voltage divider network well known in the art and the voltages L1 to L5 appearing at the taps of this voltage divider are determined by both the ratio of the resistors selected as well as the value of voltage $V_{HI}$. For the purpose of this disclosure it is assumed that the resistor values are selected such that the voltages V1 to V5 appearing at the taps represent binarily weighted voltages. Thus, the voltage L1 is twice voltage L2 and so on for the remaining taps of this resistive voltage divider.

Thus, analog signal voltage V1 appearing at terminal A of capacitor 101 is compared with reference voltage L1 appearing at the first tap of the resistive voltage divider to determine if the analog signal voltage V1 is greater than this reference voltage. The result of this comparison represents the first bit of the digital representation of the input analog signal V1. This comparison is accomplished by connecting the second terminal A of capacitor 101 through buffer 102 to one input terminal of comparator 103 while the other input terminal of comparator 103 is connected to reference voltage L1 appearing at the first tap of the resistive voltage divider. Comparator 103 determines if the analog input signal V1 is in excess of the reference voltage L1 and if so generates a high output. The output signal from comparator 103 is stored in flip-flop 104 when the clock signal STROBE 1 is applied to the clock input of flip-flop 104, and the timing of these signals is illustrated on FIG. 2. If analog input signal V1 is less than reference voltage L1 appearing at the first tap of the resistive voltage divider, as is the case here, switch 105 is not operated since the Q output of flip-flop 104 is low. When signal φ2 appears, as is shown on FIG. 2, switch 110 will be closed and analog input signal V1 is propagated to the second stage STAGE 2 of the analog to digital converter circuit. This is accomplished by buffer 102 charging capacitor 111 to voltage V1-L2 so that the voltage level of analog input signal V1 appears at terminal A of capacitor 111 while the low output of flip-flop 104 is applied to the digital output terminal D1 indicating a "zero" decision for the first stage STAGE 1 of coding. This is shown diagrammatically on FIG. 2 wherein the input to the second stage STAGE 2 is also analog signal V1.

As discussed for the first stage STAGE 1, capacitor 111 of the second stage STAGE 2 has a second terminal A connected to analog input signal voltage V1 by buffer 102 while the first terminal B of capacitor 111 is connected to the associated tap of the resistive voltage divider which in this case supplies a reference voltage of L2 which is equal to one half of reference voltage L1. Thereby capacitor 111 is charged to the difference in voltage V1-L2 with voltage V1 appearing at the A terminal. As previously discussed, the signal stored on the capacitor (111) is applied through the buffer (112) to the comparator (113) wherein the comparator is also connected to a binarily weighted reference voltage (voltage L2). In this case, analog input signal voltage V1 exceeds the reference voltage L2 appearing at the second tap of the resistive voltage divider as is shown diagrammatically on FIG. 2. Therefore, the output of comparator 113 is a high signal, which sets flip-flop 114 when clock signal STROBE 2 is applied to the clock input of flip-flop 114 at the time indicated on FIG. 2. Flip-flop 114 set causes a high signal to appear at the Q output which signal causes switch 115 to operate, thereby connecting the first terminal B of capacitor 111 to circuit ground thereby decreasing the voltage at the B terminal of capacitor 111 by an amount equal to the reference voltage L2 appearing at the second tap of the resistive voltage divider. The + input to buffer amplifier 112 is very high impedance; so no significant change in the amount of charge stored on capacitor takes place. As a result the A terminal of capacitor 111 also decrease by an amount equal to reference voltage L2. Thus, switch 115 functions to subtract the binarily weighted reference voltage L2 from the input signal V1 yielding a new input signal V1-L2 which must be passed on to the subsequent stages STAGE 3–STAGE 5 of the analog to digital converter. This new input signal is shown diagrammatically on FIG. 2 and is labelled therein as V1-L2. Thus, the signal passed to the third stage STAGE 3 of the analog to digital converter by buffer 112 is voltage V1-L2, because switch 125 is connected to reference voltage L3 at the time capacitor 121 is being charged, and capacitor 121 is charged to the difference between voltage (V1-L2) and the reference voltage L3. Voltage (V1-L2) appears at the output of buffer amp 122 as one input to comparator 123, while the digital output of STAGE 2 is a digital bit of 1 which signal is applied by flip-flop 114 to digital output terminal D2.

Subsequent stages STAGE 3–STAGE 5 of the analog to digital converter operate in identical fashion to those described above with STAGE 3 comparator 112 having to compare analog input signal voltage V1-L2 with reference voltage L3 appearing at the third tap of the resistive voltage divider. As indicated on FIG. 2, this new input signal V1-L2 exceeds the reference voltage L3 appearing at the third tap of the resistive voltage divider and therefore another digital bit of 1 is generated and placed on digital output D3 while, as previously discussed, the input signal V1-L2 is reduced by the reference voltage L3 when switch 125 subtracts reference voltage L3 of STAGE 3 from the signal V1-L2 appearing at terminal A of capacitor 111 and the non-inverting terminal of unity gain buffer 112 thereby creating another input signal which is voltage V1-L2-L3 which signal appears at terminal A of holding capacitor 121 and which is passed on to STAGE 4 by buffer 122. STAGES 4 and 5 compare this resultant signal to the reference voltages L4 and L5 appearing at the fourth and fifth taps of the resistive voltage divider but, as can be seen from FIG. 2, this resultant signal V1-L2-L3 is less than either of these reference voltages L4, L5 and a digital output of 0 is applied to digital outputs D4 and D5.

Thus, the simple clock signals $\phi_1$, $\phi_2$, STROBE 1 and STROBE 2 are all that is needed to control the operation of the disclosed analog to digital converter. The generation of clock signals such as these are well known in the art and are not shown herein for simplicity sake since such matter is the subject of numerous elementary electrical engineering textbooks.

The disclosed analog to digital converter circuit employs a resistive voltage divider to supply the binarily decreasing reference voltages used to convert the analog signal input to a digital representation. Only a single signal propagation path is employed to sequentially process the analog input signal and binary weighted decision results from state to stage of the disclosed converter circuit wherein the required comparison and analog signal processing is accomplished. This single signal propagation path requires only one holding capacitor per stage and none of these capacitors need be matched to the others since each stage is isolated from adjacent stages by buffer circuits. Thus, the disclosed analog to digital converter circuit eliminates the need for matched capacitors, which elements are difficult to accurately match. Higher speed operation has also been achieved by processing a new input sample at the completion of each $\phi_1$ cycle. Subsequent decisions relating to a given sample are sequentially processed by propagation through the remaining stages.

While a specific embodiment of the invention has been disclosed, variations in procedural and structural detail, within the scope of the appended claims, are possible and are contemplated. There is no intention of limitation to what is contained in the abstract or the exact disclosure as herein presented. The above-described arrangements are only illustrative of the application of the principles of my invention. Normally, other arrangements may be devised by those skilled in the art without departing from the spirit and the scope of my invention.

I claim:

1. An encoder system for converting a sample (V1) of an analog signal to an n bit digital (D1-D5) signal comprising:

n serially connected coding circuits, (STAGE 1, etc.) having associated therewith n reference potentials (L1, etc.) of decreasing magnitude which are applied to each respective coding circuit in descending order wherein each said coding circuit (STAGE 1) generates one bit (D1) of said n bit digital signal and comprises:

a capacitor (101) having two terminals (A, B); one of said reference potentials (L1) connected to a first (B) of said capacitor terminals:

CHARACTERIZED IN THAT said coder circuit (STAGE 1) includes:

means for coupling (100) the residue analog signal (V1) output by the previous coding circuit of said n serially connected coding circuits, to the second (A) of said capacitor terminals;

means for comparing (103) said residue analog signal (V1) to said reference potential (L1), said comparison representing said one bit (D1) of said n bit digital signal said one bit being a 1 when said residue analog signal (V1) exceeds said reference potential (L1), said one bit being a 0 when the converse is true;

reduction means (105) responsive to said means for comparing (103) for subtracting said reference potential (L1) from said first (B) capacitor terminal when said residue analog signal (V1) exceeds said reference potential (L1) thereby reducing said residue analog signal (V1) by the same amount; and buffer means (102) responsive to said means for comparing (103) for outputting the resultant analog signal appearing on said second (A) of said capacitor terminals to the subsequent coding circuit (STAGE 2) of said n serially connected coding circuits.

2. The invention of claim 1 CHARACTERIZED IN THAT said reduction means (105) comprises switch means (105) responsive to said means for comparing (103) for connecting said first (B) terminal of said capacitor (101) to circuit ground when said residue analog signal (V1) exceeds said reference potential (L1).

3. The invention of claim 1 CHARACTERIZED IN THAT said encoder system includes reference voltage generation means (106, 116, 126, 136, 146, 150, 151, $V_{1-11}$) for generating a distinct reference voltage (L1-L5) for each said n serially connected coding circuits (STAGE 1-STAGE 5).

4. The invention of claim 3 CHARACTERIZED IN THAT said reference voltage generation means (106, 116, 126, 136, 146, 150, 151, $V_{1-11}$) comprises a resistive voltage divider havin binarily weighted taps.

5. The invention of claim 1 CHARACTERIZED IN THAT said buffer means (102) comprises an operational amplifier (102) for isolating said coding circuit (STAGE 1) from said subsequent coding circuit (STAGE 2) of said n serially connected coding circuits.

* * * * *

UNITED STATES PATENT AND TRADEMARK OFFICE
CERTIFICATE OF CORRECTION

PATENT NO. : 4,185,275
DATED : January 22, 1980
INVENTOR(S) : Robert L. Carbrey

It is certified that error appears in the above—identified patent and that said Letters Patent is hereby corrected as shown below:

On the cover sheet, Attorney, Agent or Firm "Peter Visserman" should read --James M. Graziano--.

Claim 4, column 6, line 46, change "havin" to --having--.

Signed and Sealed this

Twenty-eighth Day of October 1980

[SEAL]

Attest:

SIDNEY A. DIAMOND

Attesting Officer

Commissioner of Patents and Trademarks